United States Patent [19]

McElheny et al.

[11] Patent Number: 4,914,804
[45] Date of Patent: Apr. 10, 1990

[54] METHOD OF MAKING A SURFACE MOUNTABLE ELECTRONIC DEVICE

[75] Inventors: Donald C. McElheny, Delevan; Dale A. Ponivas, West Seneca, both of N.Y.

[73] Assignee: American Precision Industries Inc., Buffalo, N.Y.

[21] Appl. No.: 329,973

[22] Filed: Mar. 29, 1989

[51] Int. Cl.$^4$ .............................................. H01F 41/02
[52] U.S. Cl. .................... 29/602.1; 29/52.42; 29/856; 264/272.14; 264/272.19
[58] Field of Search ..................... 29/602.1, 619, 25.42, 29/25.35, 854–856; 264/272.14, 272.16, 272.19

[56] References Cited

U.S. PATENT DOCUMENTS 4,268,953  5/1981  Tetro ................................... 29/602.1
4,333,213  6/1982  Meal et al. ........................ 29/856 X Primary Examiner—Carl E. Hall
Attorney, Agent, or Firm—Christel, Bean & Linihan

[57] ABSTRACT

A method of making a surface mountable electronic device comprising the steps of providing a discrete electronic device comprising a body and a pair of spaced apart leads each of substantially circular cross-section and extending axially outwardly from the body in generally opposite directions, shaping each of the leads to provide a plate-like section in each of the leads at a location axially outwardly from the body, encapsulating the device body in electrical insulating material in a manner shaping the material to provide a body having first and second spaced apart ends and a mounting surface extending between the ends, the plate-like sections of the leads extending from the ends, and shaping each of the plate-like sections of the leads to have a contact portion extending along the mounting surface for making electrical connection to a circuit having a portion defined on a surface to which the device is mountable.

14 Claims, 1 Drawing Sheet

METHOD OF MAKING A SURFACE MOUNTABLE ELECTRONIC DEVICE

BACKGROUND OF THE INVENTION

This invention relates to the art of electronic devices, and more particularly to a new and improved method of making a surface mountable electronic device.

Surface mountable electronic devices have become increasingly desired and requested. Briefly, such devices have electrodes rather than leads and are mounted directly on the circuit paths on a circuit card or board and thereby avoid the need for apertures in the board to receive leads of devices for making electrical connection.

Heretofore, surface mountable electronic devices typically have been made by what is known as the lead frame process wherein the device is soldered to a frame then encapsulated followed by cutting out portions of the frame which become the leads for the device. This process is laborious, requiring alignment of the device on the frame and mounting each device on the frame. In addition, the lead frame process requires that the devices be within certain size limitations. Furthermore, since the lead is separately attached to the device in the lead frame method, the possibility exists that the lead can become detached from the device during use.

It would, therefore, be highly desirable to provide a method of making a surface mountable electronic device which minimizes the number of times the device is handled during the process, imposes no size limitation on the device and avoids the potential problem of lead detachment during use.

SUMMARY OF THE INVENTION

It is, therefore, a primary object of the present invention to provide a new and improved method for making a surface mountable electronic device.

It is a further object of this invention to provide such a method which is readily adapted to existing axial leaded devices for rendering them surface mountable.

It is a further object of this invention to provide such a method which avoids the potential problem of lead detachment during use of the device.

It is a further object of this invention to provide such a method which imposes no size limitations on the devices.

It is a further object to provide such a method which minimizes the number of times the device is handled during the method.

It is a more particular object of this invention to provide such a method which is convenient and easy to perform.

The present invention provides a method of making a surface mountable electronic device comprising the steps of providing a discrete electronic device comprising a body and a pair of spaced apart leads each of substantially circular cross-section and extending axially outwardly from the body in generally opposite directions, shaping each of the leads to provide a plate-like section in each of the leads at a location axially outwardly from the body, encapsulating the device body in electrical insulating material in a manner shaping the material to provide a body having first and second spaced apart ends and a mounting surface extending between the ends, the plate-like sections of the leads extending from the ends, and shaping each of the plate-like sections of the leads to have a contact portion extending along the mounting surface for making electrical connection to a circuit having a portion defined on a surface to which the device is mountable.

The foregoing and additional advantages and characterizing features of the present invention will become clearly apparent upon a reading of the ensuing detailed description together wit the included drawing wherein:

BRIEF DESCRIPTION OF THE DRAWING FIGURES

FIG. 5b is a fragmentary plan view with parts removed of the arrangement of FIG. 5a;

FIG. 6b is a fragmentary plan view with parts removed of the arrangement of FIG. 6a;

DETAILED DESCRIPTION OF THE ILLUSTRATED EMBODIMENT

Figure 1:
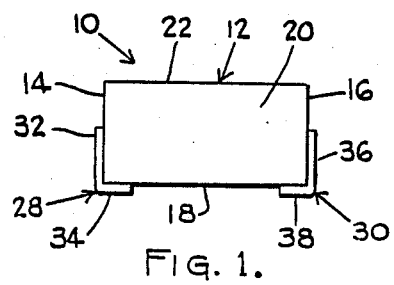
FIG. 1 is a side elevational view of a surface mountable electronic device made by the method of the present invention.
Figure 2:
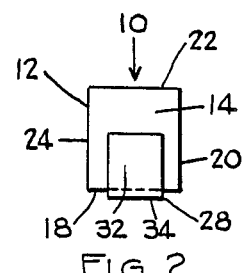
FIG. 2 is an end elevational view of the device of FIG. 1.
Figure 3:
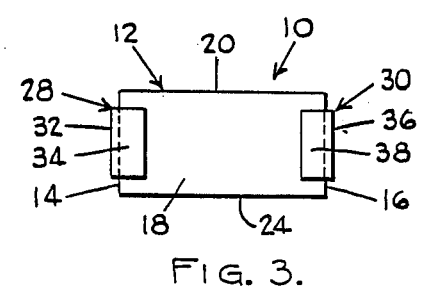
FIG. 3 is a bottom plan view of the device of FIG. 1.

Referring now to FIGS. 1-3 there is shown a surface mountable electronic device generally designated 10 made according to the method of the present invention. A discrete electronic device not shown in FIGS. 1-3) is encapsulated in a body 12 of electrical insulating material shaped to include first and second spaced-apart ends 14 and 16, respectively, and a mounting surface 1B extending between the ends. In the device shown, body 12 is a rectangular solid with ends 14,16 and mounting surface 18 being planar and which is completed by planar sides 20,22 and 24. Flat, plate-like elongated lead sections 28 and 30 electrically connected to the discrete electronic device within body 12 extend from the body ends 14 and 16, respectively. The lead sections are shaped so that each has a contact portion extending along mounting surface 18 for making electrical connection to a circuit having a portion defined on a surface to which device 10 is mountable. In particular, lead section 28 has a portion 32 extending along body end 14 and the remainder extends along mounting surface 18 to provide a constant portion 34. Similarly, lead section 30 has a portion 36 extending along body end 16 and the remainder extends along mounting surface 18 to provide a contact portion 38.

In use, the device 10 as shown in FIG. 1 simply is placed on a flat printed circuit board with mounting surface 18 on the board and the contact portions 34 and 38 in contact with appropriate sections of the circuit path defined on the board. The device 10 is soldered or otherwise mounted in place at the region of contact between contact portions 34 and 38 and the board circuit paths. In addition to avoiding the need for apertures in the circuit board, a further advantage of a surface mounted electronic device is that it frees up the opposite side of the printed circuit board for containing additional components. In other words, with a surface mounted device, there is no need to extend device leads through openings in the board for mechanical stability as is done conventionally with leaded devices.

Figure 4:
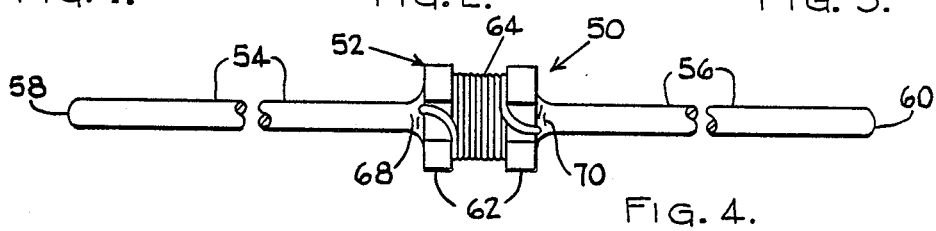
FIG. 4 is an elevational view with parts removed of an axial leaded discrete electronic device used in the method of the present invention.

FIG. 4 shows an axial leaded, discrete electronic device generally designated 50 for use in the method of the present invention for making a surface mountable electronic device such as device 10 of FIGS. 1–3. In the present illustration device 50 is an inductor, but the method of the present invention advantageously can be used with any other axial leaded electronic device capable of being encapsulated or molded, for example resistors, capacitors and diodes. In addition, the method of the present invention advantageously utilizes axial leaded discrete electronic devices such as inducator 50 which are manufactured by known, conventional and proven techniques. In other words, a surface mountable electronic device is made by the method of the present invention in a manner which does not require any modification in the manufacture of the discrete electronic device thereof which is rendered surface mountable.

Device 50 comprises a body 52 and a pair of spaced apart leads 54 and 56 each of substantially circular cross section and extending axially outwardly from body 52 in generally opposite directions and each terminating in corresponding ends 58 and 60, respectively. In the illustrative inductor 50, body 52 includes a bobbin 62 and a winding 64 thereon secured at each end to corresponding ones of the leads 54,56. The leads 54 and 56 are pressed or epoxied at 68 and 70 to corresponding ones of the bobbin flanges and the terminations of the winding 64 are soldered to the leads 54 and 56.

Figure 5A:
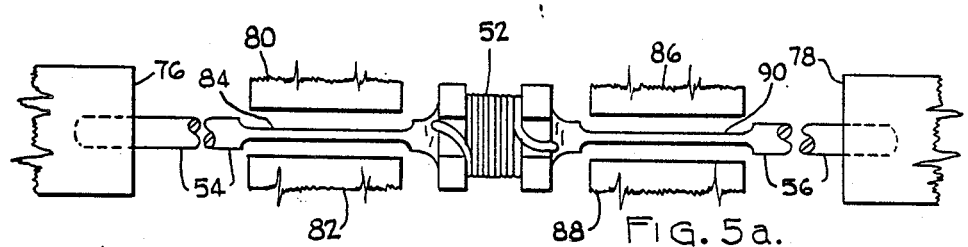
FIG. 5a is a fragmentary side elevational view with parts removed and partly diagrammatic illustrating the lead flattening step in the method of the present invention.
Figure 5B:
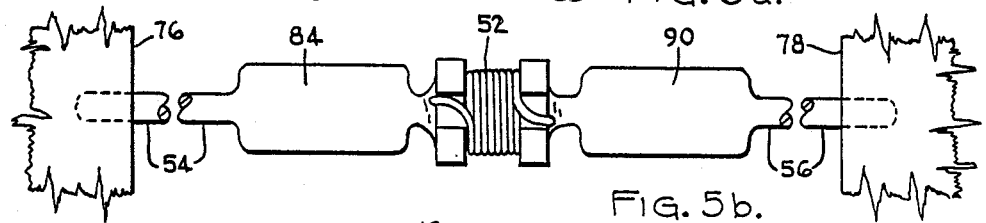
Figure 6A:
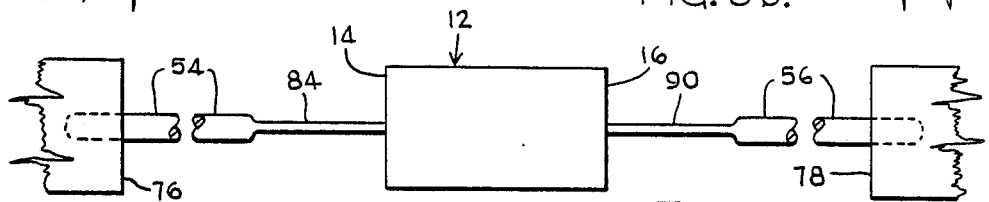
FIG. 6a is a fragmentary side elevational view with parts removed illustrating the encapsulating step in the method of the present invention.
Figure 6B:
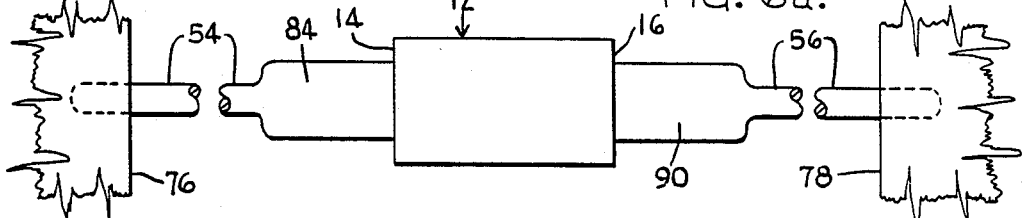

After the discrete electronic device 50 is provided, the next step in the method of the present invention is providing a supporting frame and placing the ends of the leads of device 50 in the frame so that device 50 is supported in the frame. As shown in FIGS. 5a and 5b a frame is provided having spaced-apart members 76 and 78 which receive and hold the ends 58 and 60 of leads 54 and 56, respectively. The frame members 76,78 define an open region where device 50 is supported and which allows access to device 50 and leads 54,54 from various directions. furthermore, frame members 76,78 can be elongated to hold a plurality of devices in spaced-apart relation in substantially a common plane so that steps in the method can be performed simultaneously on a number of devices.

In accordance with the present invention, the next step is shaping each of the leads 54 and 56 to provide a plate-like, flattened section in each of the leads at a location axially outwardly from body 52 and inwardly from frame members 76,78. This is accomplished by pressing each of the leads 54,56 between upper and lower jaws of a press or the like while device 50 is supported in the frame. Thus, aligned upper and lower jaws 80 and 82 move toward and away from lead 54 and press lead 54 therebetween to form a flattened, planar or plate-like section 84. As shown in FIGS. 5a and 5b, section 84 is located along lead 54 axially outwardly from body 52 and inwardly from frame 76. Similarly, aligned upper and lower jaws 86 and 88 move toward and away from lead 56 and press lead therebetween to form a flattened, planar or plate-like section 90. As shown in FIGS. 5a and 5b, section 90 is located along lead 56 axially outwardly from body 52 and inwardly from frame 78. Sections 84 and 90 are pressed or flattened to the thickness desired for the electrodes of the resulting surface mounted device. The foregoing movements of the jaw pairs 80,82 and 86,88 typically are performed simultaneously. In addition, a plurality of devices 50 held in the frame can be pressed simultaneously. Other techniques and arrangements can of course be employed for forming the flattened sections 84 and 90 in leads 54 and 56, respectively.

The next step in the method of the present invention is encapsulating the body 52 of the discrete electronic device 50 in electrical insulating material in a manner shaping the material to provide a body having first and second spaced-apart ends and a mounting surface extending between the ends, the plate like sections 84 and 90 of leads 54 and 56, respectively, extending from the ends. In the method illustrated the body of electrical insulating material is body 12 of the resulting surface mountable electronic device 10 shown in FIGS. 1–3. As previously described, the insulating body 12 is solid rectangular in shape having planar spaced-apart ends 14,16 joined by a planar mounting surface 18 and the body completed by planar sides 20,22 and 24. Body 12 thus is elongated having a longitudinal axis, and the discrete electronic device or inductor 50 is located in body 12 such that the axis of device 50 is substantially coincident with the longitudinal axis of body 12 and lead sections 84 and 90 extend along that axis and are disposed substantially perpendicular to the ends 14 and 16, respectively. The requirements for the material of body 12 are that it provides adequate electrical insulation and mechanical stability in the resulting surface mountable device. By way of example, body 12 is of high-grade, thermosetting epoxy material. Body 12 can be formed, for example, by placing the body 52 of device 50 in a mold and then introducing the epoxy material to the mold. For a further description of molding a discrete electronic device to form a surface mountable device, reference may be made to U.S. Pat. No. 4,801,912 issued Jan. 31, 1989 entitled "Surface Mountable Electronic Device" and assigned to the assignee of the present invention, the disclosure of which is hereby incorporated by reference.

Figure 7:
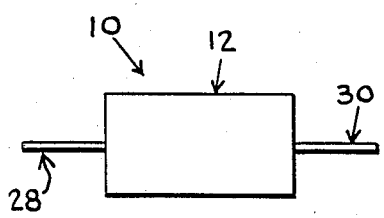
FIG. 7 is a side elevational view of a device at a stage in the method of the present invention prior to the step of shaping the lead sections.
Figure 8:
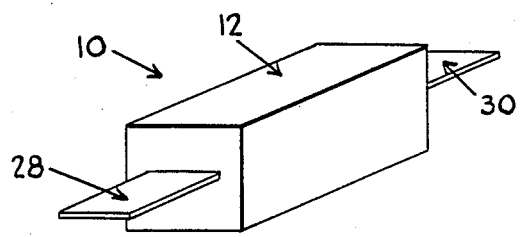
FIG. 8 is a perspective view of the device of FIG. 7.

After body 12 has been formed the resulting device is removed from the frame and the outer ends of the leads 54,56 are trimmed so that the portions of the leads extending from the ends 14,16 of body 12 include only the flattened, plate-like sections 84,90. What results is the device 10 shown in FIGS. 7 and 8 including the flat head sections 28 and 30 extending from ends 14 and 16, respectively.

The last step in the method of the present invention is shaping each of the plate-like flat lead sections 28,30 to have a contact portion extending along mounting surface 18 for making electrical connection to a circuit having a portion defined on a surface to which device 10 is surface mountable. In particular, lead section 28 is bent so that a portion 32 extends along body end 14 and the remainder extends along mounting surface 18 to provide contact portion 34. Similarly, lead section 30 is bent so that a portion 36 extends along body end 16 and the remainder extends along mounting surface 18 to provide contact portion 38. Bending of lead sections 28 and 30 is performed by techniques and tools well known in the art.

By way of example, in an illustrative device 10 made by the method of the present invention, body 12 has a length of about 0.167 inch, ends 14,16 each have dimensions of 0.095 inch by 0.095 inch and each lead sections 28,30 after trimming and before bending has a nominal length of 0.0685 inch, a width of 0.055 inch and a thickness of 0.006 inch. After bending of lead sections 28,30 the distance between the edges of contact sections 34 and 38 measured along mounting surface 18 is 0.130 inch. The surface dimensions of each contact section 34,38 are 0.055 inch by 0.024 inch.

The method of the present invention has a number of important advantages. It can be performed on any axial leaded discrete electronic device which is capable of being molded, such as inductors, resistors, capacitors and diodes. Furthermore, the method advantageously adapts existing axial leaded devices to surface mounting without the need to change electrical characteristics of the axial leaded device. The method of the present invention is applicable to all sizes, large and small, of axial leaded devices which are to be rendered surface mountable. Whereas in the prior art lead frame techniques the flat lead portions initially part of the frame are soldered to the device, in the method of the present invention the flat lead portions are formed integrally with the device leads thereby avoiding the potential problem of lead detachment during use. The method of the present invention is simpler and easier to perform than prior art methods, the parts need to be handled only twice, i.e. instsalling in and removing from the frame, and the method is readily adaptable to pick and place techniques.

It is therefore apparent that the present invention accomplishes its intended objects. While an embodiment of the present invention has been described in detail, that is for the purpose of illustration, not limitation.

What is claimed is:

1. A method of making a surface mountable electronic device comprising the steps of:
   (a) providing a discrete electronic device comprising a body and a pair of spaced apart leads each of substantially circular cross-section and extending axially outwardly from said body in generally opposite directions;
   (b) shaping each of said leads to provide a plate-like section in each of said leads at a location axially outwardly from said body;
   (c) encapsulating said device body in electrical insulation material in a manner shaping said material to provide a body having first and second spaced apart ends and a mounting surface extending between said ends, said plate-like sections of said leads extending from said ends; and
   (d) shaping each of said plate-like sections of said leads to have a contact portion extending along said mounting surface for making electrical connection to a circuit having a portion defined on a surface to which said device is mountable.

2. A method according to claim 1, further including: providing a frame; and
   (a) providing a frame; and
   (b) placing said leads in said frame with the outer ends of said leads held in said frame prior to said step of shaping said leads.

3. A method according to claim 2, including supporting a plurality of discrete electronic devices in said frame.

4. A method according to claim 3, wherein said step of shaping said lead is performed simultaneously on said plurality of devices supported in said frame.

5. A method according to claim 3, wherein said step of encapsulating is performed simultaneously on said plurality of devices supported in said frame.

6. A method according to claim 2 further including removing said device from said frame after said step of encapsulating.

7. A method according to claim 1, wherein said step of shaping said lead sections comprises bending each lead so that a portion of each lead section extends along a corresponding one of said first and second ends and the remainder of each lead section extends along said mounting surface.

8. A method according to claim 1, wherein said discrete electronic device comprises an inductor.

9. A method of making a surface mountable electronic device comprising the steps of:
   (a) providing a discrete electronic device comprising a body and a pair of spaced apart leads each of substantially circular cross section and extending axially outwardly from said body in generally opposite directions and each terminating in an end;
   (b) providing a supporting frame and placing said ends of said leads in said frame so that said device is supported by said frame;
   (c) shaping each of said leads to provide a plate-like section in each of said leads at a location axially outwardly from said body and inwardly of said frame;
   (d) encapsulating said device body in electrical insulating material in a manner shaping said material to provide a body having first and second spaced-apart ends and a mounting surface extending between said ends, said plate-like sections of said leads extending from said ends;
   (e) removing said device from said frame;
   (f) trimming the outer ends of said leads so that the portions of said leads extending from said ends of said body include only said plate-like sections; and
   (g) shaping each of said plate-like sections of said leads to have a contact portion extending along said mounting surface for making electrical connection to a circuit having a portion defined on a surface to which said device is mountable.

10. A method according to claim 9, including supporting a plurality of discrete electronic devices in said frame.

11. A method according to claim 10, wherein said step of shaping said leads is performed simultaneously on said plurality of devices supported in said frame.

12. A method according to claim 10, wherein said step of encapsulating is performed simultaneously on said plurality of devices supported in said frame.

13. A method according to claim 9, wherein said step of shaping said lead sections comprises bending each lead so that a portion of each lead section extends along a corresponding one of said first and second ends and the remainder of each lead section extends along said mounting surface.

14. A method according to claim 9, wherein said discrete electronic device comprises an inductor.

* * * * *